United States Patent
Tolchinsky et al.

(10) Patent No.: US 6,911,380 B2
(45) Date of Patent: Jun. 28, 2005

(54) METHOD OF FORMING SILICON ON INSULATOR WAFERS

(75) Inventors: Peter G. Tolchinsky, Beaverton, OR (US); Irwin Yablok, Portland, OR (US); Mohamad A. Shaheen, Portland, OR (US)

(73) Assignee: Intel Corporation, Santa Clara, CA (US)

(*) Notice: Subject to any disclaimer, the term of this patent is extended or adjusted under 35 U.S.C. 154(b) by 221 days.

(21) Appl. No.: 10/199,123

(22) Filed: Jul. 22, 2002

(65) Prior Publication Data

US 2004/0014302 A1 Jan. 22, 2004

(51) Int. Cl.⁷ .............................................. H01L 21/44
(52) U.S. Cl. ....................................... 438/514; 438/151
(58) Field of Search ................................ 438/151, 514, 438/513, 402, 406, 528

(56) References Cited

U.S. PATENT DOCUMENTS

| 5,949,108 | A |   | 9/1999 | Doyle |
| 6,051,452 | A | * | 4/2000 | Shigyo et al. ............... 438/151 |
| 6,228,691 | B1 |   | 5/2001 | Doyle |
| 6,251,754 | B1 | * | 6/2001 | Ohshima et al. ............. 438/506 |
| 6,624,049 | B1 | * | 9/2003 | Yamazaki .................... 438/476 |

* cited by examiner

*Primary Examiner*—Long Pham
*Assistant Examiner*—Hoa B. Trinh
(74) *Attorney, Agent, or Firm*—Jay P. Beale

(57) ABSTRACT

A method is provided for fabricating an SOI wafer. This may involve forming a silicon substrate and implanting oxygen into the substrate. Damaged portions of the implanted silicon may be healed/cured by CMP or anneal, for example. An epi layer may then be deposited over the healed/cured regions of the substrate. The substrate may then be annealed to form an insulative layer. The wafer may be thinned to provide the proper thickness of the epi layer.

21 Claims, 6 Drawing Sheets

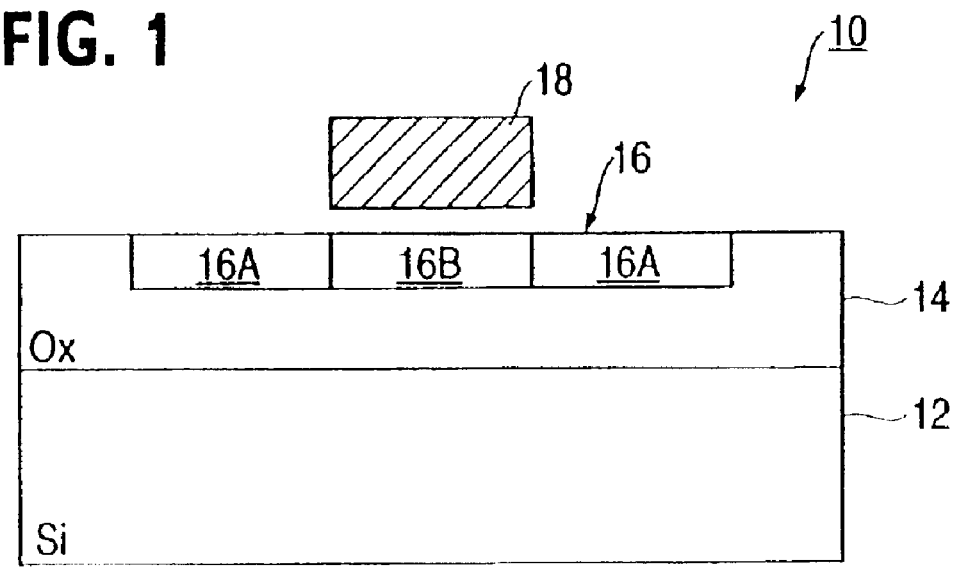
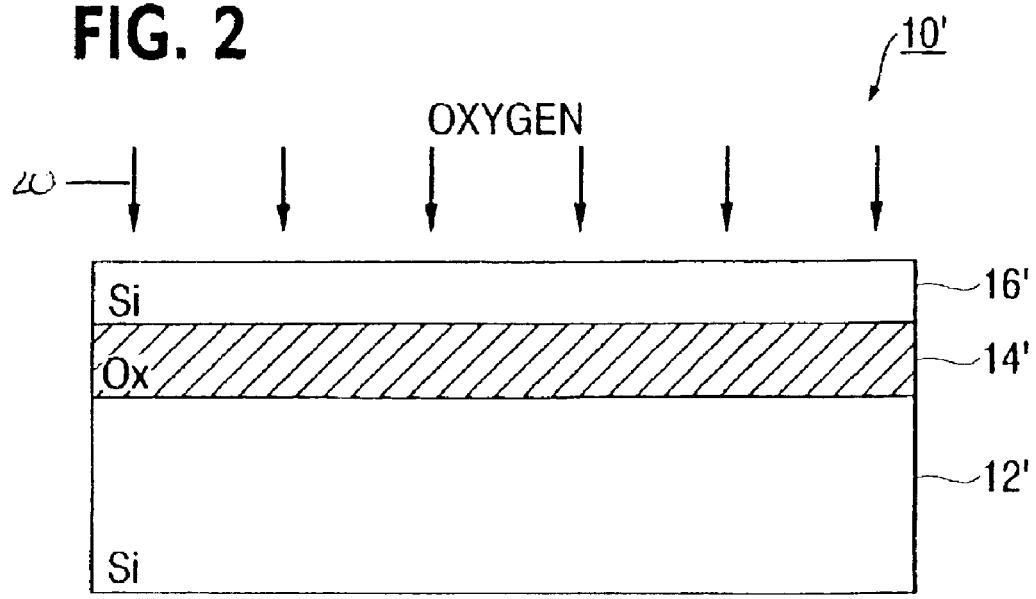

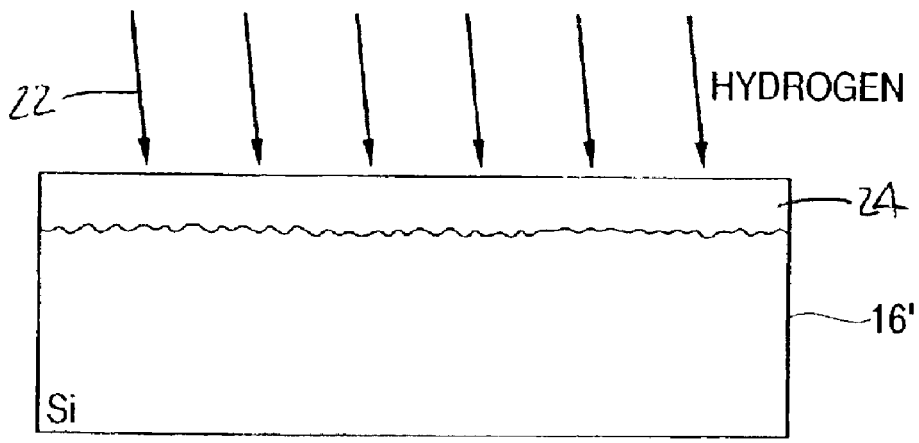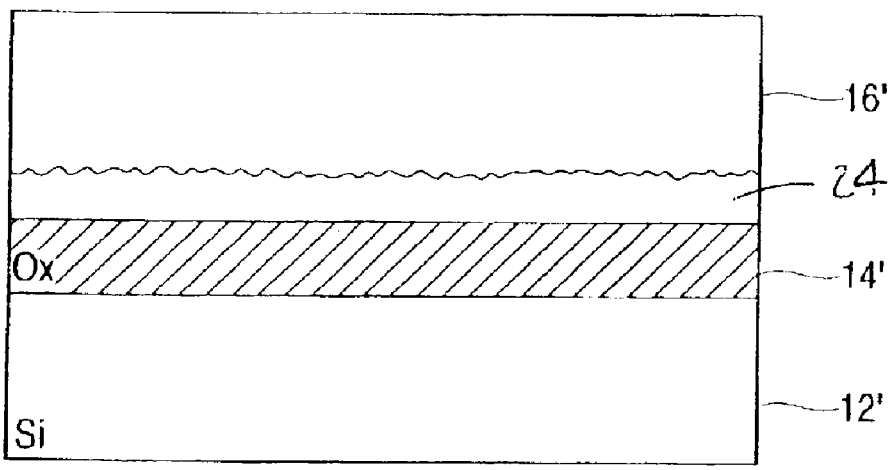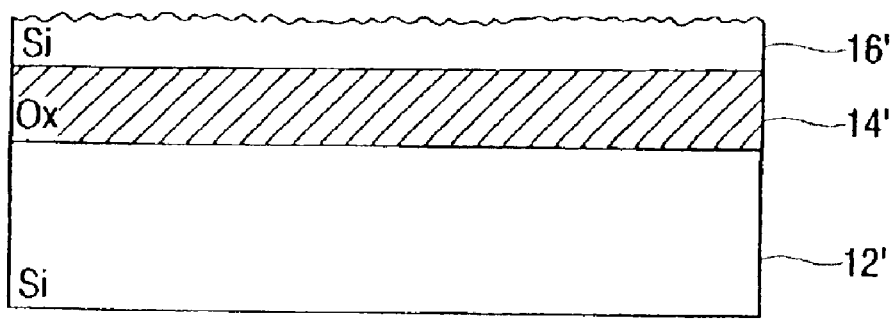

METHOD OF FORMING SILICON ON INSULATOR WAFERS

FIELD

The present invention relates to a semiconductor process and, more particularly, relates to a method of forming silicon-on-insulator wafers.

BACKGROUND

Silicon-on-insulator (SOI) substrates have become desirable for many technologies, including metal-oxide semiconductor (MOS), complementary metal-oxide semiconductor (CMOS) devices, and advanced MOS junction-type field-effect transistors (MOSFETs). This is primarily because SOI fabrication processes result in increased packing densities, improved performances, better device isolations and reduced extrinsic parasitic elements, particularly those of the source and drain as well as leakage currents and thus significantly speeding up circuit operations.

As the name implies, SOI substrates generally include a thin layer of silicon on top of an insulator, wherein circuit components are formed in and on the thin layer of silicon. The insulator can be silicon oxide ($SiO_2$), sapphire, or any appropriate material. For example, a sapphire substrate may be used as an insulator for target radio-frequency (RF) applications. In contrast, a bulk silicon wafer with an oxide layer as an insulator in the substrate may be used for target digital logic applications. In both cases, the insulator may serve to reduce junction capacitance between the heavily-doped devices and the lightly-doped bulk substrate, which may translate to less power consumption and greater circuit speed.

There are several techniques available for the fabrication of SOI substrates. One technique for fabricating SOI substrates is known as "separation by implantation of oxygen" (SIMOX), where oxygen is implanted below the silicon surface and the substrate is annealed to provide a buried silicon oxide layer with a silicon overlayer. The implantation time can be intensive and cost prohibitive. Moreover, the SOI substrate may be exposed to high surface damage and contamination. Another technique is known as "bond-and-etch-back" SOI (BESOI), where an oxidized wafer is first diffusion-bonded to an unoxidized wafer, and the backside of the oxidized wafer is then grinded, polished, and etched to the desired device layer. The BESOI approach may be free from the implant damage inherent in the SIMOX approach. However, a time consuming sequence of grinding, polishing, and etching may be required. Another technique is known as the hydrogen implantation and separation approach in which hydrogen is implanted into silicon with a thermally grown oxide to form embrittlement of the silicon substrate underneath the oxide layer. The implanted wafer may then be bonded with another silicon wafer having an oxide overlayer. The bonded wafer may be "cut" across the wafer at the peak location of the hydrogen implant by appropriate annealing.

BRIEF DESCRIPTION OF THE DRAWINGS

A better understanding of the present invention will become apparent from the following detailed description of example embodiments and the claims when read in connection with the accompanying drawings, all forming a part of the disclosure of this invention. While the following written and illustrated disclosure discloses example embodiments of the invention, it should be clearly understood that the same is by way of illustration and example only and that the invention is not limited thereto.

The following represents brief descriptions of the drawings in which like reference numerals represent like elements and wherein:

FIG. 1 illustrates an example silicon-on-insulator (SOI) substrate;

FIG. 2 illustrates a separation by implantation of oxygen (SIMOX) substrate manufacturing process of fabricating a SOI substrate according to one example arrangement;

FIGS. 4A–4C illustrate a hydrogen implantation and separation substrate manufacturing process of fabricating a SOI substrate according to one example arrangement;

DETAILED DESCRIPTION

Figure 3A:
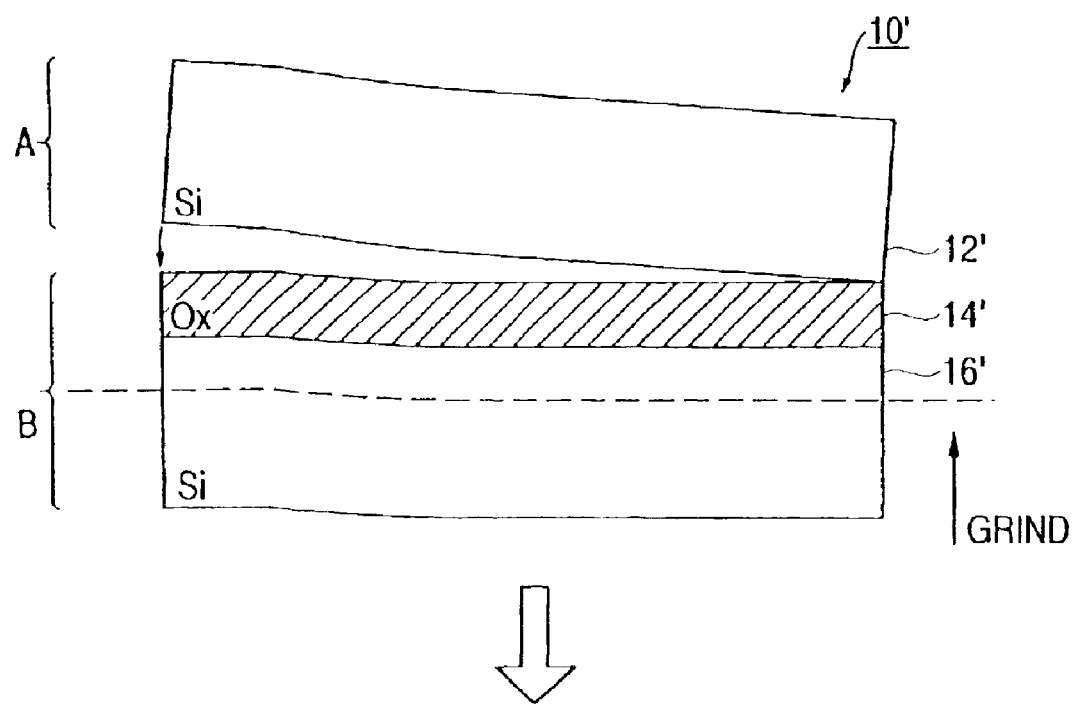
FIGS. 3A and 3B illustrate a bond-and-etch-back SOI (BESOI) substrate manufacturing process of fabricating a SOI substrate according to one example arrangement.

In the following detailed description, like reference numerals and characters may be used to designate identical, corresponding or similar components in differing figure drawings. Further, in the detailed description to follow, example values may be given, although the present invention is not limited to the same. Where specific details (e.g., flowcharts) are set forth in order to describe example embodiments of the invention, it should be apparent to one skilled in the art that the invention can be practiced without, or with variation of, these specific details.

Embodiments of the present invention may be applicable for use with all types of semiconductor substrates and silicon-on-insulator (SOI) devices, including, for example, MOS transistors, CMOS devices, dual-gate MOSFETs, and new memory devices that may become available as semiconductor technology develops in the future.

FIG. 1 illustrates a silicon-on-insulator (SOI) substrate 10 according to an example arrangement. Other arrangements are also possible. The SOI substrate 10 may include a semiconductor wafer 12, a dielectric layer 14 (such as $SiO_2$ and the like) formed on the main surface of the semiconductor substrate 12 to reduce capacitance, and a silicon layer 16 (known as a SOI layer) having a desired thickness formed on the dielectric layer 14. The semiconductor wafer 12 may be silicon, sapphire, or any appropriate material. A SOI device may be formed on the silicon layer 16 and include source/drain regions 16A, a channel region 16B and a gate electrode 18. The SOI device may represent, for example, an NMOS transistor or a PMOS transistor in which the dopant impurity regions 16A may be heavily doped with a high concentration of either n-type of impurity or p-type of impurity. High concentration impurity ions may be implanted in the silicon layer 16 using a mask to form the dopant impurity regions (i.e., the source/drain regions 16A). In either case, the dielectric layer 14 may serve to reduce junction capacitance between the heavily-doped SOI device and the non-doped or lightly-doped silicon wafer 12 in order to reduce power consumption and obtain greater circuit speed.

As discussed above, the SOI substrate 10 may be fabricated by several different techniques, including separation by implantation of oxygen (SIMOX), bonding-and-etch-back SOI (BESOI), hydrogen implantation and separation, and selective epitaxial growth (SEG) and epitaxial lateral overgrowth (ELO). A SOI substrate (or wafer) may also be fabricated according to embodiments of the present invention as will be discussed below.

FIG. 2 illustrates a separation by implantation of oxygen (SIMOX) substrate manufacturing process of fabricating a SOI substrate 10' according to an example arrangement. Other arrangements are also possible. As shown in FIG. 2, a high-dose of oxygen ions 20 may be implanted into the single-crystal silicon wafer 12' and a high temperature anneal processing may be used to cause a portion of the silicon atoms within the silicon wafer 12' and the implanted oxygen ions 20 to react, so that a buried oxide layer 14' is formed in the silicon wafer 12' with a silicon overlayer 16'. For example, for high-dose oxygen implantation, an implantation energy of 150–200 KeV, an ion dose of approximately $2 \times 10^{18}/cm^2$ and a substrate temperature greater than 600° C. may be used. The high dose oxygen implantation may then be followed by a high annealing temperature of greater than 1300° C. for at least 8 hours. For low dose oxygen implantation, a lower dose of oxygen of approximately $4 \times 10^{17}/cm^2$ and an annealing atmosphere of inert gas such as argon (Ar) and oxygen ($O_2$) may be used. The temperature and oxidation time period may be increased or decreased in proportion to the thickness of the buried oxide layer.

Figure 3B:
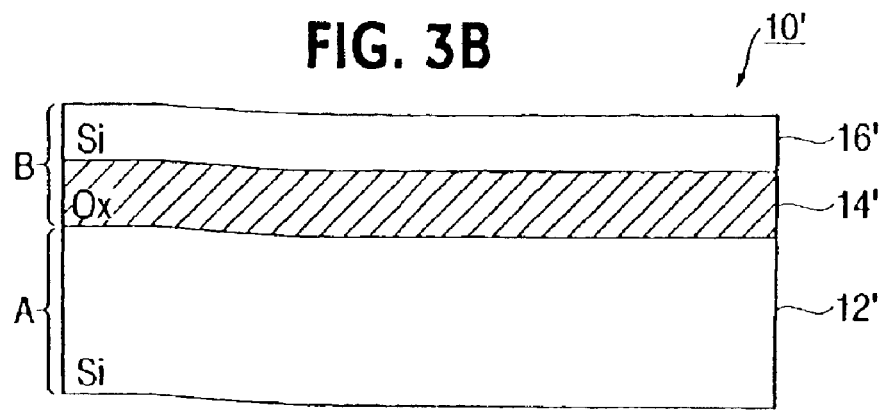

FIGS. 3A and 3B illustrate a bond-and-etch-back SOI (BESOI) substrate manufacturing process of fabricating a SOI substrate according to an example arrangement. Other arrangements are also possible. As shown in FIG. 3A, two separate silicon substrates (wafers) A and B may be used for diffusion bonding and then grinded, polished and etched to the desired silicon layer. For example, the surface of the second silicon substrate B may be oxidized to form an oxide layer 14'. Oxide may be formed by thermal oxidation or chemical vapor deposition (CVD). The oxidized silicon substrate B may then be diffusion-bonded to an unoxidized silicon substrate A at the oxidized surface. After the oxidized, second silicon substrate B is bonded to the unoxidized, first silicon substrate A, the backside of the oxidized substrate B may then be grinded, polished, and etched to the desired silicon layer 16' as shown in FIG. 3B. However, the BESOI approach may be time consuming since a laborous sequence of grinding, polishing, and etching is required. In addition, substantial silicon may be wasted. Moreover, uniform thickness of both the silicon layer 16' and oxide layer 14' may be difficult to achieve.

FIGS. 4A–4C illustrate a hydrogen implantation and separation substrate manufacturing process of fabricating a SOI substrate 10' according to an example arrangement. Other arrangements are also possible. As shown in FIG. 4A, a heavy dose of hydrogen ions 22 may be implanted into the silicon wafer 12' with a thermally grown oxide to form embrittlement 24 in the silicon above the oxide layer 14'. The implanted wafer may then be bonded with another silicon wafer with an oxide layer 14' as shown in FIG. 4B. The bonded wafer may be "cut" across the wafer at the peak location of the hydrogen implant by appropriate annealing, as shown in FIG. 4C, to form the silicon layer 16'. This approach may not be suitable for fabricating fully-depleted SOI substrates, however, since the uniform thickness of the silicon layer 16' of the SOI substrate 10' may still be difficult to obtain.

Figure 5A:
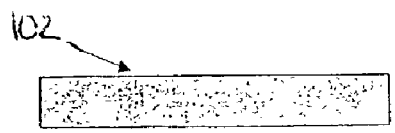
FIGS. 5A–5F illustrate a manufacturing process of fabricating a SOI substrate according to one example embodiment of the present invention.
Figure 5B:
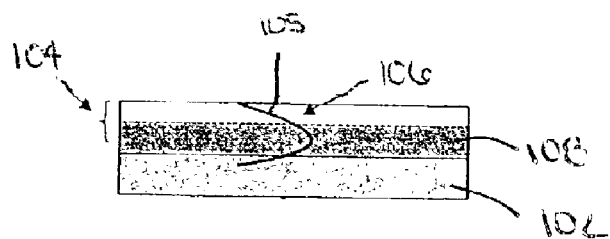

FIGS. 5A–5F illustrate a manufacturing process of fabricating a SOI substrate according to an example embodiment of the present invention. Other embodiments are also within the scope of the present invention. More specifically, FIG. 5A shows a silicon substrate 102 such as a single crystal silicon polished wafer. In FIG. 5B, the substrate 102 may be implanted with oxygen ions 104 to achieve the required buried oxide (BOX) thickness. The implantation may damage the silicon surface by disturbing the crystal lattice. As such, FIG. 5B shows a damaged silicon layer 106 and a silicon/implanted oxygen layer 108. Curve 105 represents a distribution of the oxygen ions within the silicon.

Figure 5C:
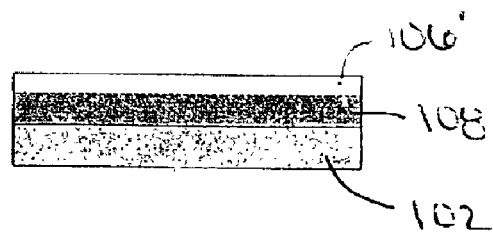

In FIG. 5C, the damaged silicon layer 106 may be treated to heal or cure the top layer over the substrate 102. More specifically, the top surface may be treated to heat/cure the damaged silicon layer 106 and to make the device ready for a subsequent epi deposition. The heating/curing of the damaged layer may correct dislocations or holes in the damaged silicon layer 106. This may also be considered a smoothing operation to remove defects from the top of the silicon in preparation for the subsequent epi deposition. The wafer may be treated by CMP or an annealing process, for example. Other methods of treating the top surface layer are also within the scope of the present invention. The treated top layer is shown as layer 106' in FIG. 5C.

Figure 5D:
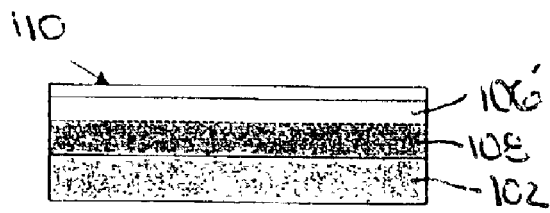

In FIG. 5D, an epi layer 110, such as a substantially pure silicon layer, may be deposited over the layer 106'. The epi layer 110 may be deposited by a CVD process, for example. One such CVD process may use a RF heated low-pressure chemical vapor deposition (LPCVD) reactor at, for example, 978° C. at 40 Torr with dichlorosilane, hydrogen, and HCl. The epi layer 110 may fill in crystal originated pits (COPs) from the layer 106'.

Figure 5E:
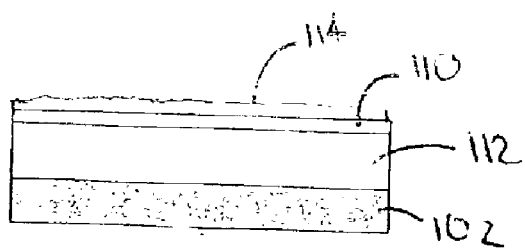
Figure 5F:
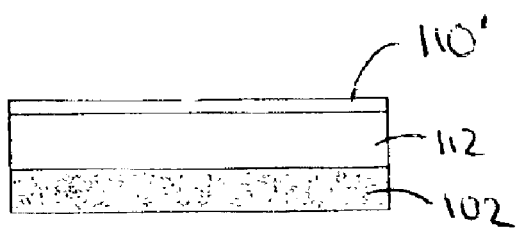

The wafer may be annealed in FIG. 5E to form an $SiO_2$ layer 112 from the silicon/implanted oxygen layer 108 and the layer 106'. The $SiO_2$ layer 112 forms the insulative layer for the final SOI device. The annealing may also add a $SiO_2$ layer 114 over the epi layer 110 as a result of the oxygen of the anneal consuming the silicon from the epi layer 110. In FIG. 5F, the $SiO_2$ layer 114 may be removed and the epi layer 110 may be thinned (and form an epi layer 110') to a desired thickness using a chemical mechanical polishing (CMP) machine, for example.

Although not shown in FIG. 5F, SOI islands may be subsequently formed in the epi layer 110' and SOI devices may be fabricated in the SOI island regions.

Figure 6:
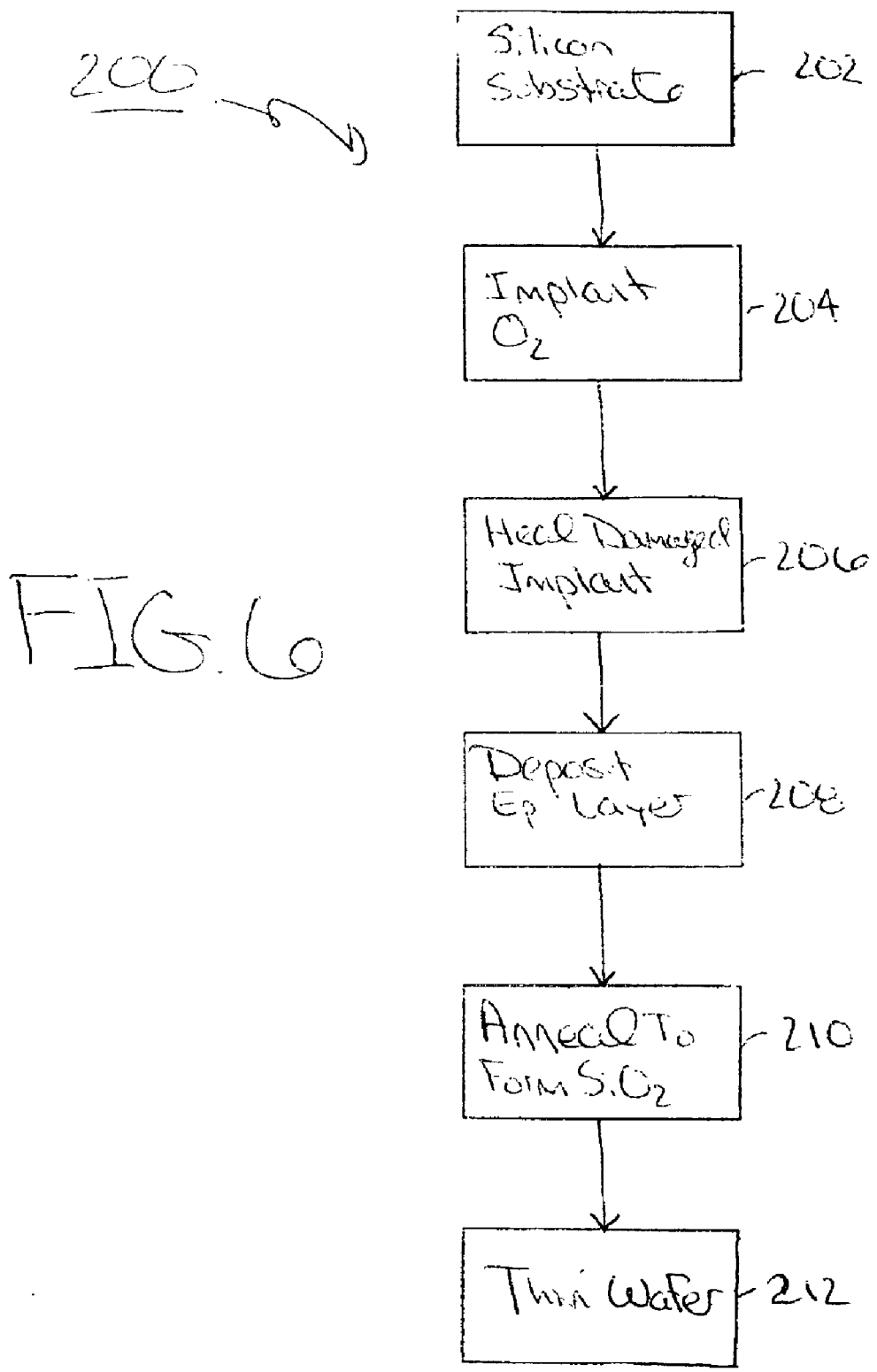
FIG. 6 is a flowchart showing a fabrication process according to an example embodiment of the present invention.

FIG. 6 is a flowchart 200 showing operations to form a SOI device (or wafer) according to an example embodiment of the present invention. Other embodiments, operations and orders of operations are also within the scope of the present invention. In block 202, a polished silicon substrate may be initially provided. Oxygen ions may be implanted into the silicon substrate in block 204. The implanted and damaged layer may be healed or cured in block 206. Subsequently, the epi layer may be deposited in block 208. The wafer may be annealed in block 210 to form the $SiO_2$ layer. The wafer may then be thinned in block 212. Subsequent operations of the SOI manufacturing may include inspection measurements of different quality parameters. The SOI wafer may then be ready for device fabrication.

Embodiments of the present invention may provide the growth of an epi layer after implantation and before annealing. More specifically, during the annealing process, the oxide growth may consume the damaged silicon leaving a high quality epi layer for device processing. The oxygen implant energy and dose may be targeted in a specific range to ensure that the damaged silicon (and not the overgrown epi layer) is consumed during the annealing. The implant energy may determine the depth of the implant and the dose may determine the thickness of the final oxide (i.e., the consumed silicon). Both the energy and dose may ensure that the damaged silicon is converted to silicon oxide while the device uses the high quality epi layer.

While embodiments have been described with respect to specific elements and materials, embodiments of the present invention are not limited to the disclosed materials. That is, other materials are also within the scope of the present invention. For example, the ions used for implantation (such as in FIG. 5B) may be oxygen, nitrogen or a combination thereof. The epi layer (such as in FIG. 5D) may be silicon, germanium or a combination thereof, for example. Additionally, the substrate may be silicon, polysilicon or quartz, for example.

Embodiments of the present invention may provide a high productivity process for manufacturing high quality SOI silicon wafers. The quality of the wafers may be superior to SIMOX wafers since the silicon layer has a lower COP epi layer. Additionally, uniformity of the top silicon layer may be controlled by the epi process rather than an implantation process as in SIMOX.

Any reference in this specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc.

Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A method of fabricating a wafer comprising:
   implanting ions into a substrate using a selected implant energy and a selected dose to form an ion-implanted layer;
   healing damaged portions of the substrate;
   depositing a substantially pure layer over the implanted ions; and
   annealing the substrate to form an insulative layer by consuming the ion-implanted layer, wherein selected implant energy and a selected dose are selected to increase an amount of the ion-implanted layer that is consumed through annealing and reduce the amount of the substantially pure layer that is consumed through annealing.

2. The method of claim 1, further comprising thinning the wafer after forming the insulative layer.

3. The method of claim 1, wherein the substrate comprises silicon.

4. The method of claim 1, wherein the ions comprise oxygen ions.

5. The method of claim 1, wherein the substantially pure layer comprises silicon.

6. The method of claim 1, wherein the healing comprises one of a polishing process and an annealing process.

7. The method of claim 6, wherein the healing improves dislocations in the damaged portions.

8. A method comprising:
   implanting ions into a wafer, using a selected implant energy and a selected dose to form an ion-implanted layer;
   healing damaged portions of the wafer;
   depositing an epi layer over the implanted ions; and
   forming an insulative layer below the epi layer by consuming the ion-implanted layer, wherein selected implant energy and a selected dose are selected to increase an amount of the ion-implanted layer that is consumed through annealing and reduce the amount of the substantially pure layer that is consumed through annealing.

9. The method of claim 8, further comprising thinning the wafer after forming the insulative layer.

10. The method of claim 8, wherein a substrate of the wafer comprises silicon.

11. The method of claim 8, wherein the ions comprise oxygen ions.

12. The method of claim 8, wherein the epi layer comprises silicon.

13. The method of claim 8, wherein the healing comprises one of a polishing process and an annealing process.

14. The method of claim 13, wherein the healing improves dislocations in the damaged portions.

15. A method of fabricating a silicon-on-insulator wafer, the method comprising:
   implanting ions into a substrate using a selected implant energy and a selected dose to form an ion-implanted layer;
   curing damaged portions of the substrate;
   depositing a substantially pure layer over the cured damaged portions; and
   annealing the substrate to form an insulative layer by consuming the ion-implanted layer, wherein selected implant energy and a selected dose are selected to increase an amount of the ion-implanted layer that is consumed through annealing and reduce the amount of the substantially pure layer that is consumed through annealing.

16. The method of claim 15, further comprising thinning the wafer after forming the insulative layer.

17. The method of claim 15, wherein the substrate comprises silicon.

18. The method of claim 15, wherein the ions comprise oxygen ions.

19. The method of claim 15, wherein the substantially pure layer comprises silicon.

20. The method of claim 15, wherein the curing comprises one of a polishing process and an annealing process.

21. The method of claim 15, wherein the curing improves dislocations in the damaged portions.

* * * * *